US010622197B2

(12) United States Patent
Kubota et al.

(10) Patent No.: US 10,622,197 B2
(45) Date of Patent: Apr. 14, 2020

(54) PLASMA PROCESSING APPARATUS AND PLASMA PROCESSING METHOD

(71) Applicant: Tokyo Electron Limited, Tokyo (JP)

(72) Inventors: Shinji Kubota, Miyagi (JP); Takashi Dokan, Miyagi (JP); Koji Koyama, Miyagi (JP); Naoki Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 269 days.

(21) Appl. No.: 15/746,154

(22) PCT Filed: Jul. 19, 2016

(86) PCT No.: PCT/JP2016/071101
§ 371 (c)(1),
(2) Date: Jan. 19, 2018

(87) PCT Pub. No.: WO2017/014210
PCT Pub. Date: Jan. 26, 2017

(65) Prior Publication Data
US 2018/0211818 A1 Jul. 26, 2018

(30) Foreign Application Priority Data
Jul. 21, 2015 (JP) .................................. 2015-144345

(51) Int. Cl.
*H01J 37/32* (2006.01)

(52) U.S. Cl.
CPC .... *H01J 37/3299* (2013.01); *H01J 37/32302* (2013.01); *H01J 37/32311* (2013.01); *H01J 2237/24564* (2013.01)

(58) Field of Classification Search
CPC ............. H01J 37/3209; H01J 37/32302; H01J 37/32311; H01J 37/32917; H01J 37/3299; H01J 2237/244–245; H01J 2237/24564
See application file for complete search history.

(56) References Cited

U.S. PATENT DOCUMENTS

| 10,436,717 B2* | 10/2019 | Omstead ................. G01J 3/443 |
| 2005/0060103 A1* | 3/2005 | Chamness ............ G05B 23/024 |
| | | 702/30 |

(Continued)

FOREIGN PATENT DOCUMENTS

| JP | 2000-031073 A | 1/2000 |
| JP | 2006-286254 A | 10/2006 |

(Continued)

OTHER PUBLICATIONS

International Search Report for PCT/JP2016/071101 dated Sep. 20, 2016.

*Primary Examiner* — Jason Crawford
(74) *Attorney, Agent, or Firm* — Pearne & Gordon LLP

(57) ABSTRACT

A plasma processing apparatus includes a processing vessel; a carrier wave group generating unit configured to generate a carrier wave group including multiple carrier waves having different frequencies belonging to a preset frequency band centered on a predetermined center frequency; a plasma generating unit configured to generate plasma by using the carrier wave group; a spectrum detecting unit configured to detect a progressive wave spectrum and a reflection wave spectrum of the carrier wave group; and a control unit configured to calculate, by using the progressive wave spectrum and the reflection wave spectrum, an absorption power which is a power of the carrier wave group absorbed into the plasma, and configured to adjust a parameter, which varies a minimum value of the reflection wave (Continued)

spectrum and a frequency corresponding to the minimum value, such that the absorption power becomes equal to or larger than a threshold value.

8 Claims, 12 Drawing Sheets

(56) References Cited

U.S. PATENT DOCUMENTS

| | | | |
|---|---|---|---|
| 2005/0222781 A1* | 10/2005 | Yue ..................... | G05B 13/041 |
| | | | 702/30 |
| 2015/0122421 A1* | 5/2015 | Konno .............. | H01J 37/32165 |
| | | | 156/345.28 |
| 2016/0079037 A1* | 3/2016 | Hirano .............. | H01J 37/32146 |
| | | | 156/345.28 |
| 2016/0109502 A1* | 4/2016 | Kaneko ................ | G01R 31/255 |
| | | | 702/60 |
| 2017/0103874 A1* | 4/2017 | Kaneko ............. | H01J 37/32935 |
| 2018/0090301 A1* | 3/2018 | Kubota .............. | H01J 37/3299 |
| 2018/0151332 A1* | 5/2018 | Kaneko ................... | H01J 37/32 |
| 2019/0148115 A1* | 5/2019 | Kubota ........... | H01J 373/32302 |
| | | | 315/111.21 |
| 2019/0244789 A1* | 8/2019 | Kaneko ............. | H01J 37/32311 |

FOREIGN PATENT DOCUMENTS

| | | |
|---|---|---|
| JP | 2015-122150 A | 7/2015 |
| JP | 04-299282 A | 9/2016 |
| WO | 2013/088723 A1 | 6/2013 |
| WO | 2014/034318 A1 | 3/2014 |

\* cited by examiner

PLASMA PROCESSING APPARATUS AND PLASMA PROCESSING METHOD

CROSS-REFERENCE TO RELATED APPLICATION

This Application is a U.S. national phase application under 35 U.S.C. § 371 of PCT Application No. PCT/JP2016/071101 filed on Jul. 19, 2016, which claims the benefit of Japanese Patent Application No. 2015-144345 filed on Jul. 21, 2015, the entire disclosures of which are incorporated herein by reference.

TECHNICAL FIELD

The various embodiments described herein pertain generally to a plasma processing apparatus and a plasma processing method.

BACKGROUND ART

There is known a plasma processing apparatus using excitation of a processing gas by a microwave. For example, this plasma processing apparatus generates a microwave having a single frequency by using a microwave oscillator and generates plasma by radiating the microwave into a processing vessel and ionizing a processing gas within the processing vessel.

In the plasma processing apparatus using the excitation of the processing gas by the microwave, however, a reflection wave of the microwave may be generated depending on a usage condition, and a power absorbed into the plasma from the microwave may be decreased because of this reflection wave.

In this regard, there is known a technique in which a tuner for impedance matching is provided between the microwave oscillator and the processing vessel, the power of the reflection wave of the microwave is detected, and a position of a movable plate within the tuner is adjusted such that the power of the reflection wave of the microwave is minimized.

DISCLOSURE OF THE INVENTION

Problems to be Solved by the Invention

In the aforementioned prior art, however, in case of generating plasma by using a carrier wave group including multiple carrier waves having different frequencies instead of the microwave having the single frequency, it is difficult to absorb a power of the carrier wave group to into the plasma with high efficiency.

Means for Solving the Problems

In an exemplary embodiment, there is provided a plasma processing apparatus including a processing vessel; a carrier wave group generating unit configured to generate a carrier wave group including multiple carrier waves having different frequencies belonging to a preset frequency band centered on a predetermined center frequency; a plasma generating unit configured to generate plasma within the processing vessel by using the carrier wave group; a spectrum detecting unit configured to detect a progressive wave spectrum, which is a frequency spectrum of a progressive wave of the carrier wave group, and a reflection wave spectrum, which is a frequency spectrum of a reflection wave of the carrier wave group; and a control unit configured to calculate, by using the progressive wave spectrum and the reflection wave spectrum, an absorption power which is a power of the carrier wave group absorbed into the plasma, and configured to adjust a parameter, which varies a minimum value of the reflection wave spectrum and a frequency corresponding to the minimum value, such that the absorption power becomes equal to or larger than a threshold value.

Effect of the Invention

According to the exemplary embodiment of the plasma processing apparatus, it is possible to absorb a power of a carrier wave group into plasma with high efficiency.

DETAILED DESCRIPTION

Figure 1:
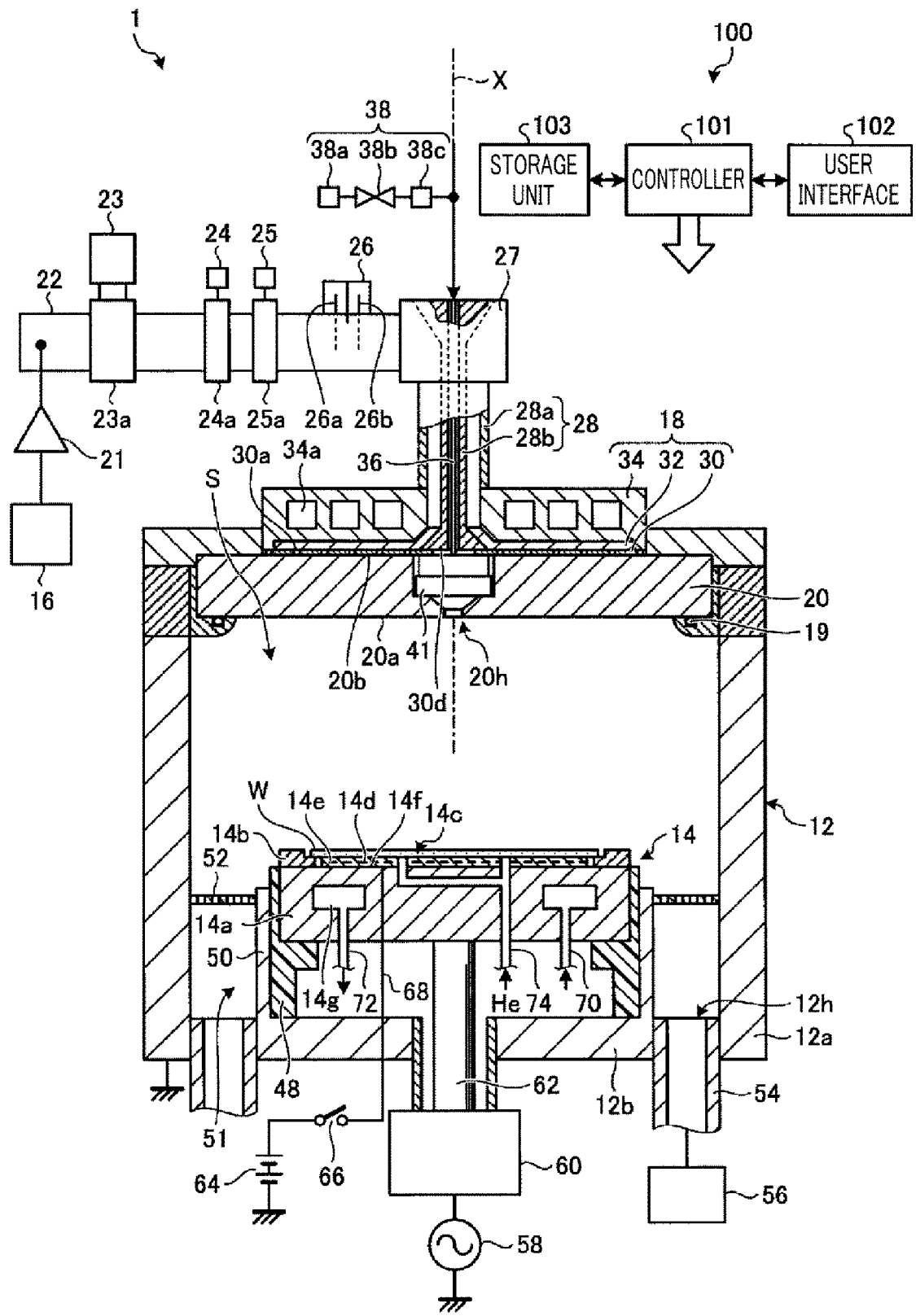
FIG. 1 is a diagram schematically illustrating a plasma processing apparatus according to a first exemplary embodiment.

In the following, a plasma processing apparatus according to exemplary embodiments will be described in detail. In the various drawings, same or corresponding parts will be assigned same reference numerals.

First Exemplary Embodiment

FIG. 1 is a diagram schematically illustrating a plasma processing apparatus according to a first exemplary embodiment. A plasma processing apparatus 1 shown in FIG. 1 is equipped with a processing vessel 12, a stage 14, a carrier wave group generating unit 16, an antenna 18, a dielectric window 20 and a control unit 100.

The processing vessel 12 has therein a processing space S for performing a plasma processing therein. The processing vessel 12 has a sidewall 12a and a bottom 12b. The sidewall 12a has a substantially cylindrical shape. Hereinafter, an imaginary axis line X extended at a center of the cylindrical shape of the sidewall 12a is set, and an extension direction of the axis line X is defined as an axis line X direction. The bottom 12b is provided at a lower end of the sidewall 12a and closes a bottom opening of the sidewall 12a. The bottom 12b is provided with an exhaust hole 12h for gas exhaust. An upper end of the sidewall 12a is opened.

An upper end opening of the sidewall 12a is closed by the dielectric window 20. An O-ring 19 is provided between the dielectric window 20 and the upper end of the sidewall 12a. The dielectric window 20 is provided at the upper end of the sidewall 12a with the O-ring 19 therebetween. The O-ring 19 allows the processing vessel 12 to be sealed airtightly. The stage 14 is accommodated in the processing space S, and a processing target object W is placed on the stage 14. The dielectric window 20 has a facing surface 20a which faces the processing space S.

The carrier wave group generating unit 16 is configured to generate a carrier wave group including multiple carrier waves having different frequencies belonging to a preset frequency band centered on a predetermined center frequency. By way of example, the carrier wave group generating unit 16 has a PLL (Phase Locked Loop) oscillator configured to oscillate a microwave having a phase synchronized with a reference frequency; and an IQ digital modulator connected to the PLL oscillator. The carrier wave group generating unit 16 sets a frequency of the microwave oscillated from the PLL oscillator as the center frequency. Further, the carrier wave group generating unit 16 generates the carrier wave group by generating, with the IQ digital modulator, the multiple carrier waves having the different frequencies belonging to the preset frequency band centered on the frequency of the microwave which is set as the center frequency. For example, if inverse discrete Fourier transform is performed on N number of complex data symbols and continuous signals are generated, the carrier wave group of the present disclosure can be generated. This signal generation method may be implemented by the same method as an OFDMA (Orthogonal Frequency-Division Multiple Access) modulation method for use in digital broadcasting or the like (see, for example, Japanese Patent No. 5,320,260). Further, the center frequency and the frequency band of the carrier wave group generated by the carrier wave group generating unit 16 are controlled by the control unit 100 to be described later.

Figure 2:
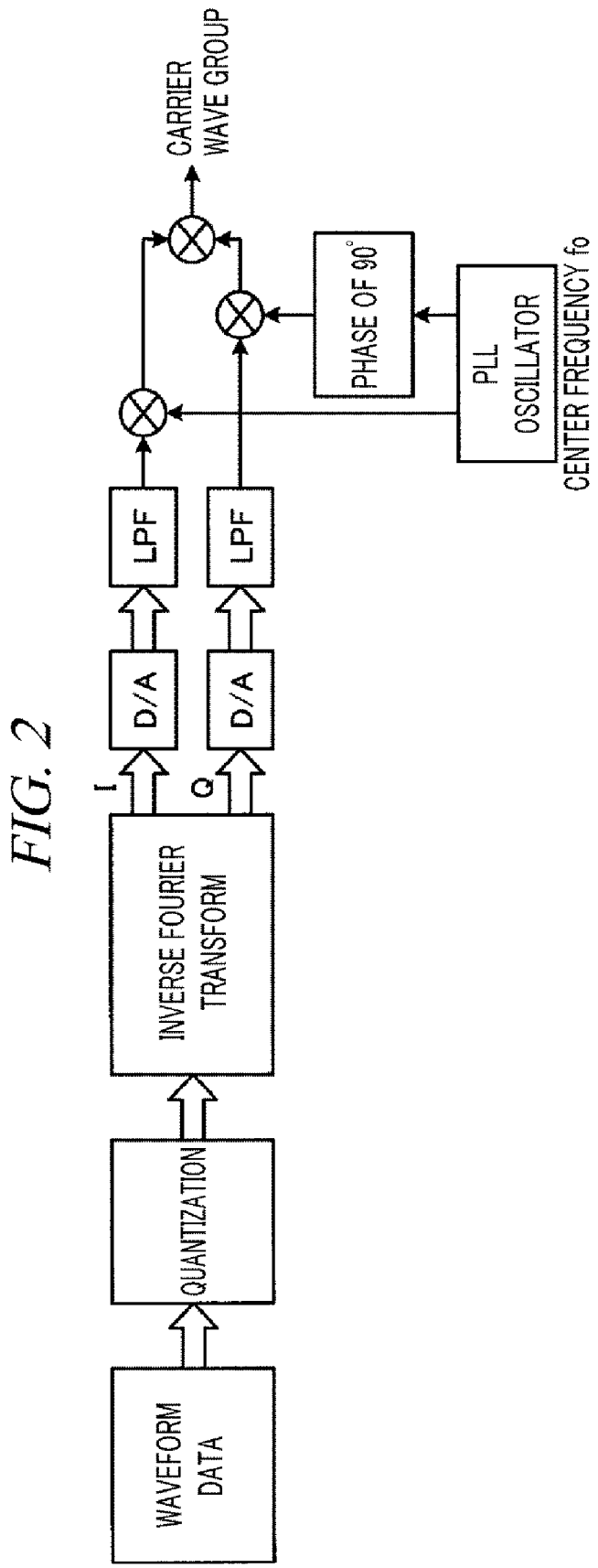
FIG. 2 is a diagram for describing an example of a method of generating a carrier wave group.

FIG. 2 is a diagram for describing an example of a method of generating the carrier wave group. Waveform data is a sequence of previously digitized codes. By quantizing the waveform data and performing inverse Fourier transform thereon, I data and Q data are separated. Then, each of the I data and the Q data is D/A (Digital/Analog)-converted and is inputted to a LPF (low pass filter) which allows only low frequency components to pass therethrough. Meanwhile, carrier waves having a phase difference of 90° are generated from a carrier wave (e.g., a microwave) having a center frequency fo oscillated from the PLL oscillator. Then, by modulating the carrier waves having the phase difference of 90° with the I data and the Q data output from the LPF, a carrier wave group is generated. In the present exemplary embodiment, the carrier wave group is obtained by multiplexing a carrier wave with a pitch of 10 kHz and a bandwidth of 40 MHz by using a microwave having a center frequency of 2450 MHz. By setting the phases of neighboring carrier waves to be orthogonal (different by 90°), a large number of closest carrier waves can be arranged.

Figure 3A:
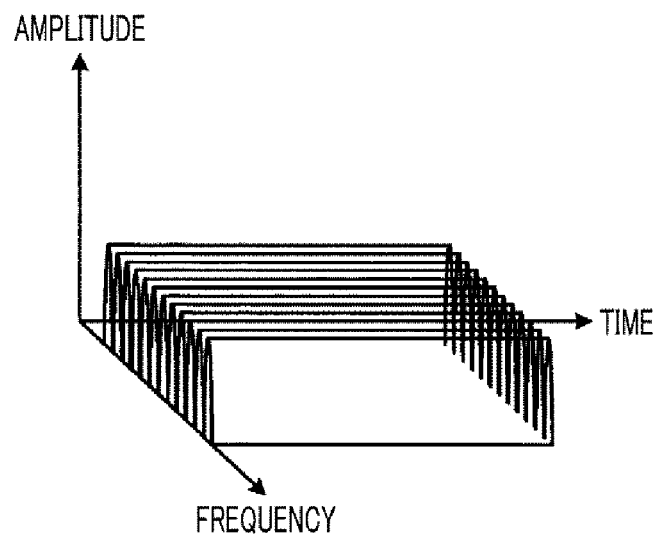
FIG. 3A is a diagram illustrating an example of a waveform of the carrier wave group.
Figure 3B:
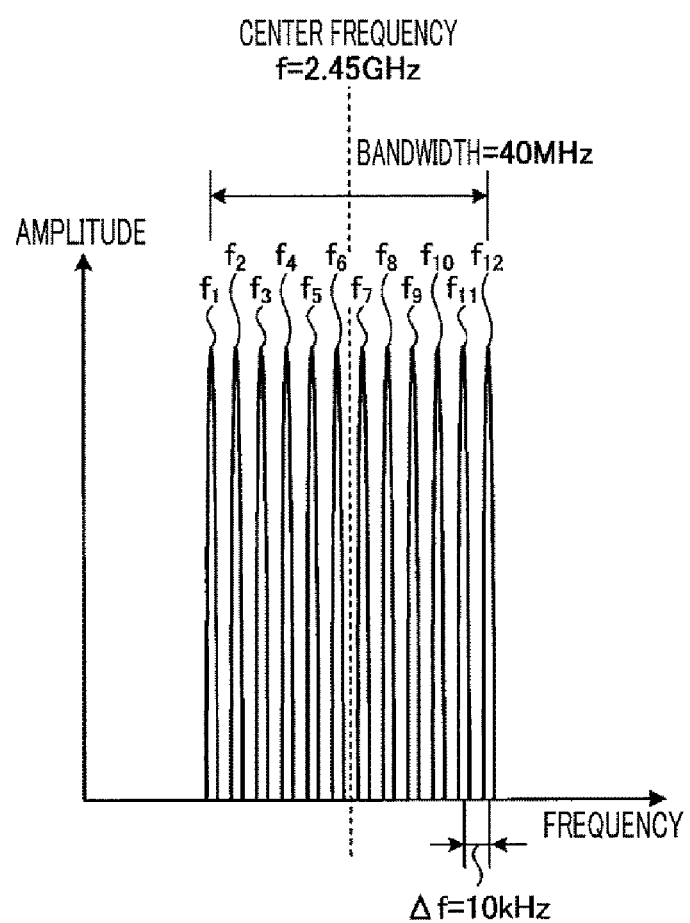
FIG. 3B is a diagram illustrating the example of the waveform of the carrier wave group.
Figure 3C:
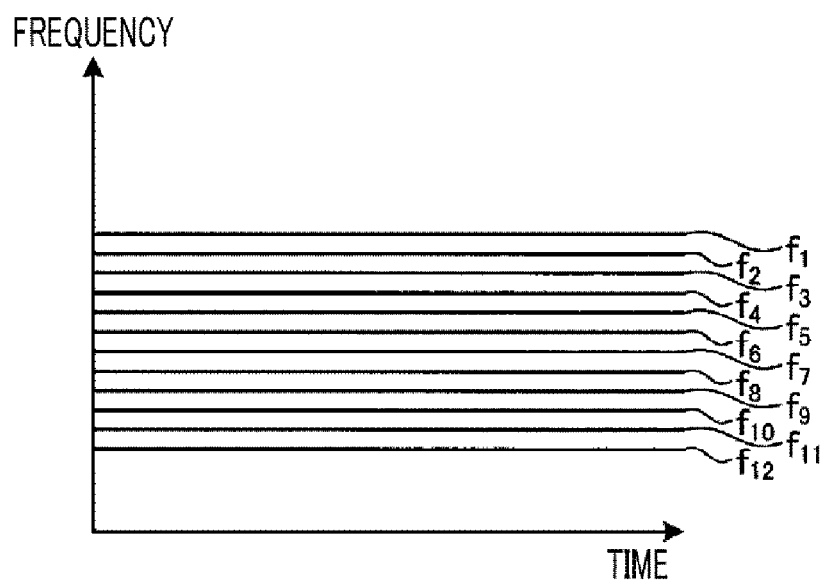
FIG. 3C is a diagram illustrating the example of the waveform of the carrier wave group.
Figure 3D:
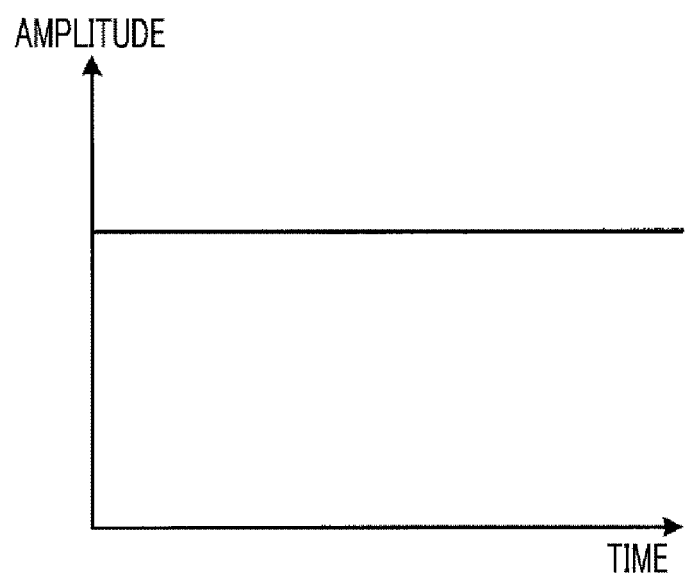
FIG. 3D is a diagram illustrating the example of the waveform of the carrier wave group.

Here, a waveform of the carrier wave group generated by the carrier wave group generating unit 16 will be explained. FIG. 3A to FIG. 3D are diagrams illustrating an example of the waveform of the carrier wave group. FIG. 3A shows the waveform of the carrier wave group in a three-dimensional coordinate space formed by a time axis, a frequency axis and an amplitude axis. FIG. 3B shows the waveform of the carrier wave group in a two-dimensional coordinate space formed by the frequency axis and the amplitude axis. FIG. 3C shows the waveform of the carrier wave group in a two-dimensional coordinate space formed by the time axis and the frequency axis. FIG. 3D shows the waveform of the carrier wave group in a two-dimensional coordinate space formed by the time axis and the amplitude axis.

As depicted in FIG. 3A to FIG. 3D, the carrier wave group is composed of multiple carrier waves $f_1$ to $f_{12}$ having different frequencies belonging to a preset frequency band (e.g., 40 MHz) centered on a predetermined center frequency (e.g., 2.45 GHz). The frequency of each carrier wave is maintained constant regardless of a lapse of time. Further, the multiple carrier waves have the same amplitude. The amplitude of each carrier wave is maintained constant regardless of a lapse of time. Moreover, among the multiple carrier waves, at least two carrier waves having neighboring frequencies in the preset frequency band have a phase difference of 90°. For example, the phases of the carrier wave $f_1$ and the carrier wave $f_2$ having neighboring frequencies may be different by 90°. Furthermore, the frequencies of the multiple carrier waves are arranged at a regular interval (e.g., 10 kHz) within the preset frequency band.

Referring back to FIG. 1, the plasma processing apparatus 1 further includes an amplifier 21, a waveguide 22, a dummy load 23, a progressive wave spectrum detector 24, a reflection wave spectrum detector 25, a tuner 26, a mode converter 27 and a coaxial waveguide 28.

The carrier wave group generating unit 16 is connected to the waveguide 22 via the amplifier 21. The amplifier 21 is configured to amplify the carrier wave group generated by the carrier wave group generating unit 16 and output the amplified carrier wave group to the waveguide 22. The waveguide 22 may be, but not limited to, a rectangular waveguide. The waveguide 22 is connected to the mode converter 27, and the mode converter 27 is connected to an upper end of the coaxial waveguide 28.

The dummy load 23 is connected to the waveguide 22 via a circulator 23a. The circulator 23a is configured to extract the reflection wave of the carrier wave group reflected from the processing vessel 12 and output the extracted reflection wave of the carrier wave group to the dummy load 23. The dummy load 23 converts the reflection wave of the carrier wave group input from the circulator 23a to heat by a load or the like.

The progressive wave spectrum detector 24 is connected to the waveguide 22 via a directional coupler 24a. The directional coupler 24a is configured to extract the progressive wave of the carrier wave group heading toward the processing vessel 12 and output the extracted progressive wave of the carrier wave group to the progressive wave spectrum detector 24. A coupling degree of the directional coupler 24a is, for example, 60 dBm, and a directivity of the directional coupler 24a is, by way of non-limiting example, 35 dBm. The progressive wave spectrum detector 24 is configured to detect the frequency spectrum of the progressive wave of the carrier wave group input from the directional coupler 24a (hereinafter, referred to as "progressive wave spectrum") and output the detected progressive wave spectrum to the control unit 100. Further, the progressive wave spectrum is a distribution of the power of the progressive wave of the carrier wave group with respect to the frequency of the progressive wave of the carrier wave group, and is detected by performing Fourier transform on the progressive wave of the carrier wave group.

Figure 4:
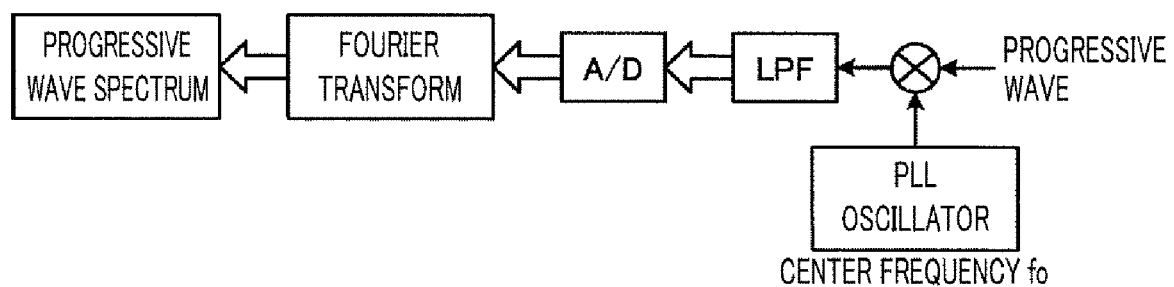
FIG. 4 is a diagram for describing an example of a method of detecting a progressive wave spectrum.

FIG. 4 is a diagram for describing an example of a method of detecting the progressive wave spectrum. In the example shown in FIG. 4, it is assumed that the center frequency of the carrier wave group generated by the carrier wave group generating unit 16 is fo, and a bandwidth of this carrier wave group is 40 MHz. As depicted in FIG. 4, as the progressive wave of the carrier wave group input to the progressive wave spectrum detector 24 from the directional coupler 24a (hereinafter, appropriately referred to as "progressive wave") and a sine wave signal of the center frequency fo oscillated from the PLL oscillator are multiplied, the progressive wave is demodulated, so that a demodulated signal is obtained. In this case, the demodulated signal has a bandwidth of 40 MHz. The obtained demodulated signal passes through the LPF having a passband of about 100 MHz and is A/D-converted by an A/D converter. Further, a clock frequency of the A/D converter is, for example, equal to or higher than twice the bandwidth of the carrier wave group. Here, for example, the clock frequency of the A/D converter is set to be 80 MHz. By performing Fourier transform on the A/D-converted demodulated signal, multiple frequency components included in the progressive wave are extracted. By using these frequency components, the distribution of the power of the progressive wave of the carrier wave group with regard to the frequency of the progressive wave of the carrier wave group, that is, the progressive wave spectrum is detected.

The reflection wave spectrum detector 25 is connected to the waveguide 22 via a directional coupler 25a. The directional coupler 25a is configured to extract the reflection wave of the carrier wave group reflected from the processing vessel 12 and output the extracted reflection wave of the carrier wave group to the reflection wave spectrum detector 25. A coupling degree of the directional coupler 25a is, for example, 60 dBm, and a directivity of the directional coupler 25a is, by way of non-limiting example, 35 dBm. The reflection wave spectrum detector 25 is configured to detect the frequency spectrum of the reflection wave of the carrier wave group input from the directional coupler 25a (hereinafter, referred to as "reflection wave spectrum") and output the detected reflection wave spectrum to the control unit 100. Further, the reflection wave spectrum is a distribution of the power of the reflection wave of the carrier wave group with respect to the frequency of the reflection wave of the carrier wave group, and is detected by performing Fourier transform on the reflection wave of the carrier wave group. The progressive wave spectrum detector 24 and the reflection wave spectrum detector 25 are an example of a spectrum detecting unit.

Figure 5:
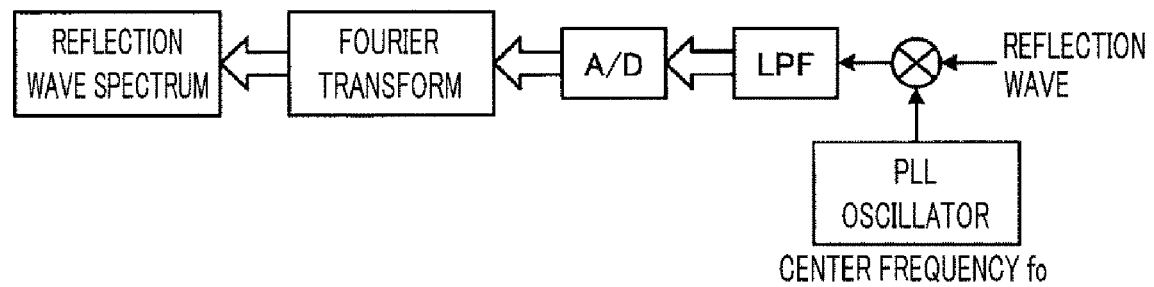
FIG. 5 is a diagram for describing an example of a method of detecting a reflection wave spectrum.

FIG. 5 is a diagram for describing an example of a method of detecting the reflection wave spectrum. In the example shown in FIG. 5, it is assume that the center frequency of the carrier wave group generated by the carrier wave group generating unit 16 is fo, and the bandwidth of this carrier wave group is 40 MHz. As depicted in FIG. 5, as the reflection wave of the carrier wave group input to the reflection wave spectrum detector 25 from the directional coupler 25a (hereinafter, appropriately referred to as "reflection wave") and the sine wave signal of the center frequency fo oscillated from the PLL oscillator are multiplied, the reflection wave is demodulated, so that a demodulated signal is obtained. In this case, the demodulated signal has a bandwidth of 40 MHz. The obtained demodulated signal passes through the LPF having the passband of about 100 MHz and is A/D-converted by the A/D converter. Further, the clock frequency of the A/D converter is, for example, equal to or higher than twice the bandwidth of the carrier wave group. Here, for example, the clock frequency of the A/D converter is set to be 80 MHz. By performing Fourier transform on the A/D-converted demodulated signal, multiple frequency components included in the reflection wave are extracted. By using these frequency components, the distribution of the power of the reflection wave of the carrier wave group with respect to the frequency of the reflection wave of the carrier wave group, that is, the reflection wave spectrum is detected.

The tuner 26 is provided at the waveguide 22 and has a function of matching impedances between the carrier wave group generating unit 16 and the processing vessel 12. The tuner 26 has movable plates 26a and 26b configured to be protrusible into a space within the waveguide 22. The tuner 26 matches the impedance between the carrier wave group generating unit 16 and the processing vessel 12 depending on protruding positions of the movable plates 26a and 26b with respect to a reference position. The movable plates 26a and 26b are an example of a movable member.

The coaxial waveguide 28 is extended along the axis line X. The coaxial waveguide 28 includes an outer conductor 28a and an inner conductor 28b. The outer conductor 28a has a substantially cylindrical shape extended in the axis line X direction. The inner conductor 28b is provided within the outer conductor 28a. This inner conductor 28b has a substantially cylindrical shape extended along the axis line X.

The carrier wave group generated by the carrier wave group generating unit 16 is transmitted to the mode converter 27 through the tuner 26 and the waveguide 22. The mode converter 27 is configured to convert a mode of the carrier wave group and supply the mode-converted carrier wave group to the coaxial waveguide 28. The carrier wave group from the coaxial waveguide 28 is supplied to the antenna 18.

The antenna 18 is configured to radiate a carrier wave group for plasma excitation based on the carrier wave group generated by the carrier wave group generating unit 16. The antenna 18 has a slot plate 30, a dielectric plate 32 and a cooling jacket 34. The antenna 18 is provided on a surface 20b of the dielectric window 20 opposite from the facing surface 20a, and radiates the carrier wave group for plasma excitation into the processing space S through the dielectric window 20 based on the carrier wave group generated by the carrier wave group generating unit 16.

The slot plate 30 is formed to have a substantially circular plate shape having a plate surface orthogonal to the axis line X. The slot plate 30 is placed on the surface 20b of the dielectric window 20 opposite from the facing surface 20a with the plate surface thereof aligned to that of the dielectric window 20. The slot plate 30 is provided with a multiple number of slots 30a arranged in a circumferential direction with respect to the axis line X. The slot plate 30 is of a type constituting a radial line slot antenna. The slot plate 30 is made of a metal having conductivity and has the substantially circular plate shape. The slot plate 30 is provided with the multiple number of slots 30a. Further, formed at a central portion of the slot plate 30 is a through hole 30d through which a conduction line 36 to be described later can be inserted.

The dielectric plate 32 has a substantially circular plate shape having a plate surface orthogonal to the axis line X. The dielectric plate 32 is provided between the slot plate 30 and a lower surface of the cooling jacket 34. The dielectric plate 32 is made of, by way of non-limiting example, quartz and has the substantially circular plate shape.

A surface of the cooling jacket 34 has conductivity. A flow path 34a through which a coolant flows is provided within the cooling jacket 34. The dielectric plate 32 and the slot plate 30 are cooled by the flow of the coolant. A lower end of the outer conductor 28a is electrically connected to an upper surface of the cooling jacket 34. Further, a lower end of the inner conductor 28b is electrically connected to the slot plate 30 through holes formed at central portions of the cooling jacket 34 and the dielectric plate 32.

The carrier wave group from the coaxial waveguide 28 is propagated to the dielectric plate 32 and then introduced from the slots 30a of the slot plate 30 into the processing space S through the dielectric window 20. In the first exemplary embodiment, the conduction line 36 passes through an inner hole of the inner conductor 28b of the coaxial waveguide 28. The through hole 30d is formed at the central portion of the slot plate 30, and the conduction line 36 is inserted through the through hole 30d. The conduction line 36 is extended along the axis line X and is connected to a gas supply system 38.

The gas supply system 38 is configured to supply a processing gas for processing the processing target object W into the conduction line 36. The gas supply system 38 may include a gas source 38a, a valve 38b and a flow rate controller 38c. The gas source 38a is a source of the processing gas. The valve 38b switches a supply and a stop of the supply of the processing gas from the gas source 38a. The flow rate controller 38c may be implemented by, for example, a mass flow controller and is configured to control a flow rate of the processing gas from the gas source 38a.

In the first exemplary embodiment, the plasma processing apparatus 1 is further equipped with an injector 41. The injector 41 is configured to supply the gas from the conduction line 36 into a through hole 20h of the dielectric window 20. The gas supplied into the through hole 20h of the dielectric window 20 is introduced into the processing space S. In the following description, a gas supply path formed by the conduction line 36, the injector 41 and the through hole 20h may sometimes be referred to as "central gas introduction unit".

The stage 14 is provided to face the dielectric window 20 in the axis line X direction. This stage 14 is provided such that the processing space S is formed between the dielectric window 20 and the stage 14. The processing target object W is placed on the stage 14. In the first exemplary embodiment, the stage 14 includes a table 14a, a focus ring 14b and an electrostatic chuck 14c.

The table 14a is supported by a cylindrical supporting member 48. The cylindrical supporting member 48 is made of an insulating material and is extended from the bottom 12b vertically upwards. Further, a conductive cylindrical support member 50 is provided on an outer surface of the cylindrical supporting member 48. The cylindrical support member 50 is extended from the bottom 12b of the processing vessel 12 vertically upwards along the outer surface of the cylindrical supporting member 48. An annular exhaust path 51 is formed between the cylindrical support member 50 and the sidewall 12a.

An annular baffle plate 52 having a multiple number of through holes is provided at an upper portion of the exhaust path 51, and an exhaust device 56 is connected to a lower portion of the exhaust hole 12h via an exhaust line 54. The exhaust device 56 has an automatic pressure control valve (APC) and a vacuum pump such as a turbo molecular pump. The processing space S within the processing vessel 12 can be decompressed to a required vacuum level by the exhaust device 56.

The table 14a also serves as a high frequency electrode. The table 14a is electrically connected to a high frequency power supply 58 for a RF bias via a power feed rod 62 and a matching unit 60. The high frequency power supply 58 is configured to output, at a preset power level, a high frequency power (hereinafter, appropriately referred to as "bias power") having a preset frequency of, e.g., 13.65 MHz suitable for controlling energy of ions attracted into the processing target object W. The matching unit 60 incorporates therein a matching device configured to match an impedance of the high frequency power supply 58 and an impedance at a load side thereof such as, mainly, the electrode, the plasma and the processing vessel 12. The matching device includes a blocking capacitor for self-bias generation.

An electrostatic chuck 14c is provided on a top surface of the table 14a. The electrostatic chuck 14c is configured to hold the processing target object W by an electrostatic attracting force. The focus ring 14b is provided at an outside of the electrostatic chuck 14c in a diametrical direction to surround the processing target object W annularly. The electrostatic chuck 14c includes an electrode 14d, an insulating film 14e and an insulating film 14f. The electrode 14d is made of a conductive film and is embedded between the insulating film 14e and the insulating film 14f. The electrode 14d is electrically connected to a high voltage DC power supply 64 via a switch 66 and a coated line 68. The electrostatic chuck 14c is configured to attract and hold the processing target object W by a Coulomb force generated by a DC voltage applied from the DC power supply 64.

An annular coolant path 14g is provided within the table 14a and is extended in a circumferential direction. A coolant of a preset temperature, for example, cooling water is supplied into and circulated through the coolant path 14g from a chiller unit (not shown) through pipelines 70 and 72. A top surface temperature of the electrostatic chuck 14c is controlled by the temperature of the coolant. Further, a heat transfer gas, for example, a He gas is supplied into a gap between a top surface of the electrostatic chuck 14c and a rear surface of the processing target object W through a gas supply line 74, and a temperature of the processing target object W is controlled based on the top surface temperature of the electrostatic chuck 14c.

In the plasma processing apparatus 1 having the above-described configuration, the gas is introduced through the conduction line 36 and the injector 41 and supplied into the processing space S from the through hole 20h of the dielectric window 20 along the axis line X. Further, the carrier wave group is introduced into the processing space S and/or the through hole 20h from the antenna 18 via the dielectric window 20. Accordingly, the plasma is generated in the processing space S and/or the through hole 20h. Here, the antenna 18 and the dielectric window 20 are an example of a plasma generating unit configured to generate the plasma within the processing vessel 12 by using the carrier wave group.

The control unit 100 is connected to the individual components of the plasma processing apparatus 1 and controls the individual components in an overall manner. The control unit 100 is equipped with a controller 101 having a central processing unit (CPU), a user interface 102 and a storage unit 103.

The controller 101 controls overall operations of the individual components such as the carrier wave group generating unit 16, the stage 14, the gas supply system 38 and the exhaust device 56 by executing a program and a processing recipe stored in the storage unit 103.

The user interface 102 includes a keyboard or a touch panel through which a process manager inputs a command to manage the plasma processing apparatus 1; a display configured to visually display an operational status of the plasma processing apparatus 1; and so forth.

The storage unit 103 has stored thereon control programs (software) for implementing various processings performed in the plasma processing apparatus 1 under the control of the controller 101; processing recipes in which processing condition data are recorded to allow a certain processing to be performed; and so forth. In response to an instruction from the user interface 102 or when necessary, the controller 101 retrieves various control programs from the storage unit 103 and executes the retrieved control programs, so that the required processing is performed in the plasma processing apparatus 1 under the control of the controller 101. The control programs and the recipes such as the processing condition data may be used while being stored in a computer-readable recording medium (e.g., a hard disk, a CD, a flexible disk, a semiconductor memory, etc.), or may be used on-line by being received from another apparatus through, for example, a dedicated line, whenever necessary.

By way of example, the control unit 100 may control the individual components of the plasma processing apparatus 1 to perform a plasma processing method to be described later. As a detailed example, the control unit 100 calculates an absorption power, which is a power of the carrier wave group absorbed into the plasma, by using the progressive wave spectrum received from the progressive wave spectrum detector 24 and the reflection wave spectrum received from the reflection wave spectrum detector 25. Then, the control unit 100 adjusts, such that the calculated absorption power becomes equal to or larger than a threshold value, a "parameter" which varies a minimum value of the reflection wave spectrum and a frequency corresponding to the minimum value of the reflection wave spectrum (hereinafter, referred to as "minimum reflection frequency"). In the present exemplary embodiment, by sweeping the center frequency of the carrier wave group as the "parameter" through the control of the carrier wave group generating unit 16, the control unit 100 searches for the center frequency of the carrier wave group at which the absorption power becomes equal to or larger than the threshold value.

Figure 6:
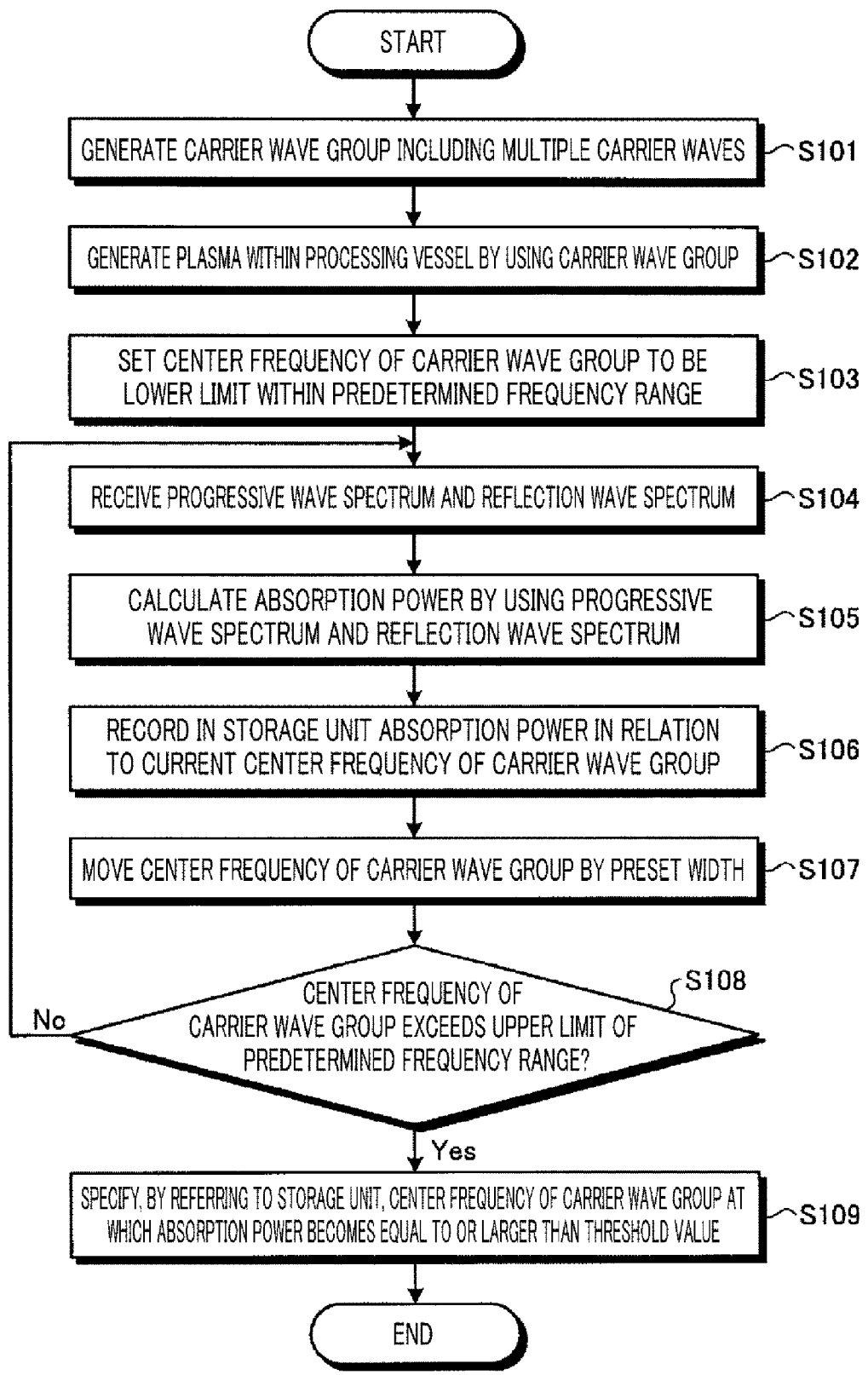
FIG. 6 is a flowchart for describing an example of a flow of a plasma processing method according to the first exemplary embodiment.

Now, the plasma processing method performed in the plasma processing apparatus 1 according to the first exemplary embodiment will be explained. FIG. 6 is a flowchart for describing an example of a flow of the plasma processing method according to the first exemplary embodiment.

As depicted in FIG. 6, the carrier wave group generating unit 16 of the plasma processing apparatus 1 generates the carrier wave group including the multiple carrier waves having the different frequencies belonging to the preset frequency band centered on the predetermined center frequency (process S101). Further, initial values of the center frequency and the frequency band of the carrier wave group generated by the carrier wave group generating unit 16 are controlled by the control unit 100.

The antenna 18 and the dielectric window 20 generate the plasma within the processing vessel 12 by using the carrier wave group (process S102).

The control unit 100 sets the center frequency of the carrier wave group to be a lower limit within a predetermined frequency range by controlling the carrier wave group generating unit 16 (process S103).

The control unit 100 receives the progressive wave spectrum and the reflection wave spectrum from the progressive wave spectrum detector 24 and the reflection wave spectrum detector 25, respectively (process S104).

The control unit 100 calculates the absorption power by using the progressive wave spectrum and the reflection wave spectrum (process S105). To be more specific, the control unit 100 calculates the absorption power by integrating a difference between the progressive wave spectrum and the reflection wave spectrum with respect to a frequency.

The control unit 100 records in the storage unit 103 the absorption power in relation to the current center frequency of the carrier wave group (process S106). Accordingly, absorption powers corresponding to different center frequencies are sequentially recorded in the storage unit 103.

The control unit 100 moves the center frequency of the carrier wave group by a preset width toward an upper limit of the predetermined frequency range by controlling the carrier wave group generating unit 16 (process S107). That is, the control unit 100 sweeps (varies) the center frequency of the carrier wave group within the predetermined frequency range as the aforementioned "parameter" by controlling the carrier wave group generating unit 16. Accordingly, the minimum value of the reflection wave spectrum and the minimum reflection frequency are varied, and, as a result, the absorption power is changed.

Figure 7:
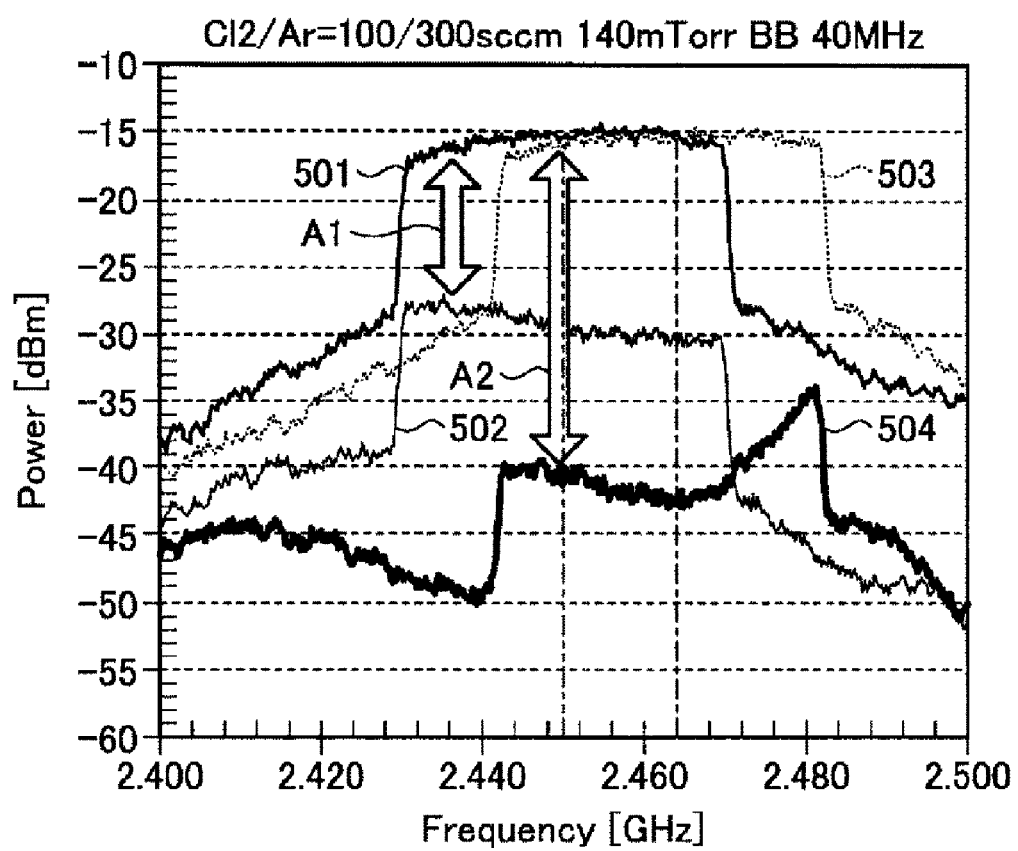
FIG. 7 is a diagram for describing a variation of an absorption power in relation to a variation of a center frequency of the carrier wave group.

FIG. 7 is a diagram for describing the variation of the absorption power in relation to the variation of the center frequency of the carrier wave group. In FIG. 7, a horizontal axis represents a frequency [GHz], and a vertical axis indicates a power [dBm]. Further, in this measurement, since the coupling degree of the directional coupler is 60 dBm, an actual power is calculated by adding 60 dBm to a value on the vertical axis. Further, in FIG. 7, a graph 501 shows the progressive wave spectrum when the center frequency of the carrier wave group is 2.450 GHz, and a graph 502 shows the reflection wave spectrum when the center frequency of the carrier wave group is 2.450 GHz. Furthermore, in FIG. 7, a graph 503 indicates the progressive wave spectrum when the center frequency of the carrier wave group is 2.464 GHz, and a graph 504 indicates the reflection wave spectrum when the center frequency of the carrier wave group is 2.464 GHz. In FIG. 7, the absorption power when the center frequency of the carrier wave group is 2.450 GHz corresponds to an area A1 of a region formed between the graph 501 and the graph 502. Further, in FIG. 7, the absorption power when the center frequency of the carrier wave group is 2.464 GHz corresponds to an area A2 of a region formed between the graph 503 and the graph 504. Furthermore, in FIG. 7, a size relationship between the area A1 and the area A2 is indicated by a size relationship between the arrows thereof. In the example of FIG. 7, as processing conditions, a processing gas and a flow rate are $Cl_2/Ar=100$ sccm/300 sccm; a pressure is set to be 140 mTorr; and the frequency band of the carrier wave group is set to be 40 MHz.

As can be seen from FIG. 7, if the center frequency of the carrier wave group is changed to 2.464 GHz from 2.450 GHz, the minimum value of the reflection wave spectrum and the minimum reflection frequency are changed. As a result, as indicated by the areas A1 and A2 in FIG. 7, the absorption power is increased.

Referring back to FIG. 6, the control unit 100 determines whether the center frequency of the carrier wave group exceeds the upper limit of the predetermined frequency range (process S108). If the center frequency of the carrier wave group does not exceed the upper limit of the predetermined frequency range (No in the process S108), the control unit 100 returns the processing back to the process S104.

On the other hand, if the center frequency of the carrier wave group exceeds the upper limit of the predetermined frequency range (Yes in the process S108), the control unit 100 specifies, by referring to the storage unit 103, the center frequency of the carrier wave group at which the absorption power becomes equal to or larger than the threshold value (process S109). The specified center frequency of the carrier wave group is set to the carrier wave group generating unit 16 by the control unit 100.

As stated above, when generating the plasma within the processing vessel 12 by using the carrier wave group, the plasma processing apparatus 1 according to the first exemplary embodiment calculates the absorption power by using the progressive wave spectrum and the reflection wave spectrum and adjusts the center frequency of the carrier wave group such that the absorption power becomes equal to or larger than the threshold value. Accordingly, while following the adjustment of the center frequency of the carrier wave group, the minimum value of the reflection wave spectrum and the minimum reflection frequency can be varied, so that the absorption power can be maximized. As a result, the power of the carrier wave group can be absorbed into the plasma with high efficiency.

Second Exemplary Embodiment

A second exemplary embodiment is different from the first exemplary embodiment in that protruding positions of the movable plates of the tuner is adjusted as the aforementioned "parameter" instead of the center frequency of the carrier wave group. Further, since a basic configuration of a plasma processing apparatus according to the second exemplary embodiment is the same as that of the plasma processing apparatus 1 according to the first exemplary embodiment, description will be made with reference to FIG. 1.

In the plasma processing apparatus 1 according to the second exemplary embodiment, the control unit 100 adjusts protruding positions of the movable plates 26a and 26b of the tuner 26 as the aforementioned "parameter" such that the absorption power becomes equal to or larger than the threshold value. To elaborate, by sweeping the protruding positions of the movable plates 26a and 26b as the aforementioned "parameter" through the control of the tuner 26, the control unit 100 searches for the protruding positions of the movable plates 26a and 26b at which the absorption power becomes equal to or larger than the threshold value.

Figure 8:
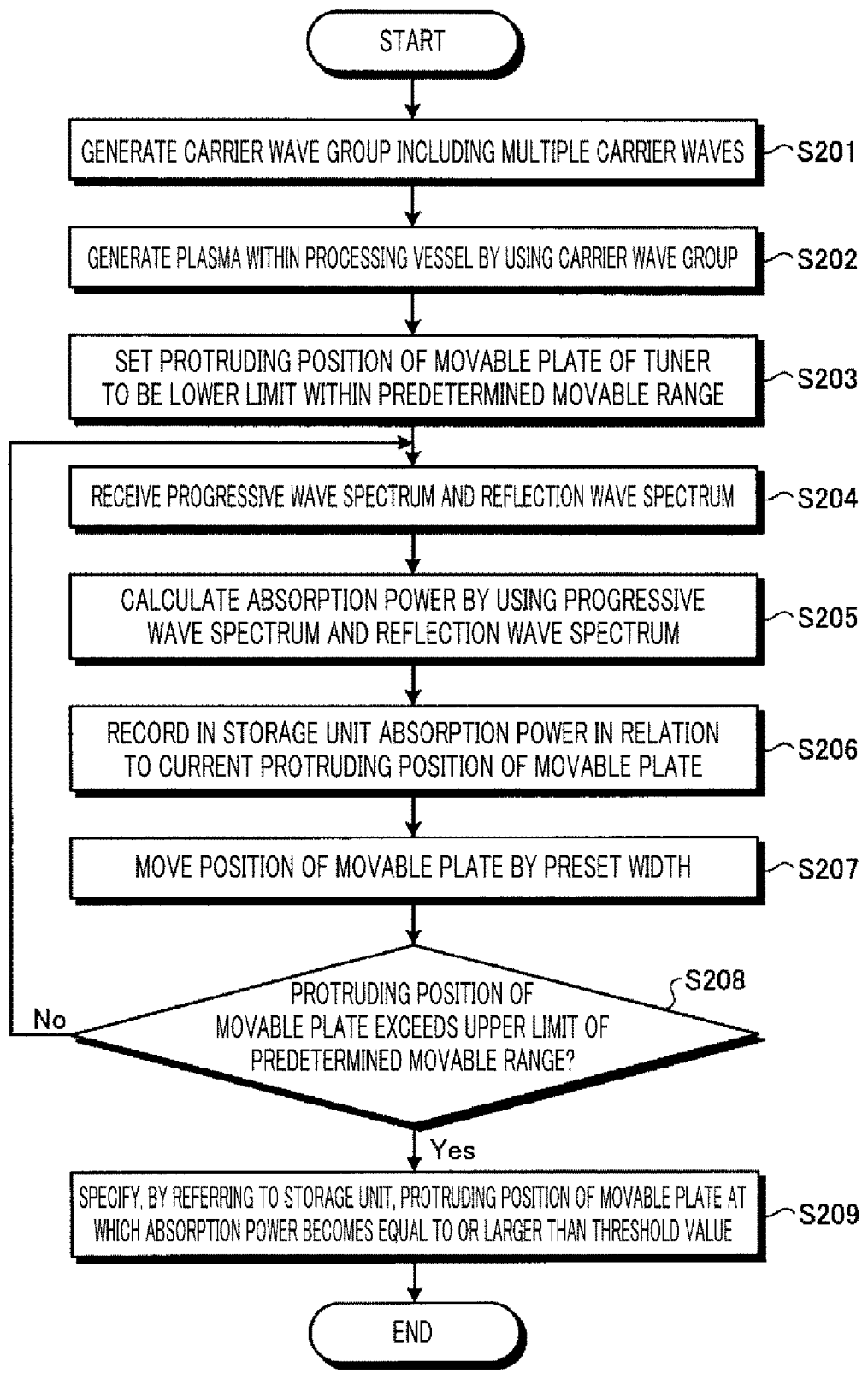
FIG. 8 is a flowchart for describing an example of a flow of a plasma processing method according to a second exemplary embodiment.

Now, a plasma processing method performed in the plasma processing apparatus 1 according to the second exemplary embodiment will be explained. FIG. 8 is a flowchart showing an example of a flow of the plasma processing method according to the second exemplary embodiment.

As shown in FIG. 8, the carrier wave group generating unit 16 of the plasma processing apparatus 1 generates the carrier wave group including the multiple carrier waves having the different frequencies belonging to the preset frequency band centered on the predetermined center frequency (process S201). Further, initial values of the center frequency and the frequency band of the carrier wave group generated by the carrier wave group generating unit 16 are controlled by the control unit 100.

The antenna 18 and the dielectric window 20 generate the plasma within the processing vessel 12 by using the carrier wave group (process S202).

The control unit 100 sets the protruding positions of the movable plates 26a and 26b to be a lower limit within a predetermined movable range by controlling the tuner 26 (process S203).

The control unit 100 receives the progressive wave spectrum and the reflection wave spectrum from the progressive wave spectrum detector 24 and the reflection wave spectrum detector 25, respectively (process S204).

The control unit 100 calculates the absorption power by using the progressive wave spectrum and the reflection wave spectrum (process S205). To be more specific, the control unit 100 calculates the absorption power by integrating a difference between the progressive wave spectrum and the reflection wave spectrum with respect to a frequency.

The control unit 100 records in the storage unit 103 the absorption power in relation to the current protruding positions of the movable plates 26a and 26b (process S206). Accordingly, absorption powers corresponding to different protruding positions of the movable plates 26a and 26b are sequentially recorded in the storage unit 103.

The control unit 100 moves the protruding positions of the movable plates 26a and 26b by a preset width toward an upper limit of the predetermined movable range by controlling the tuner 26 (process S207). That is, the control unit 100 sweeps the protruding positions of the movable plates 26a and 26b within the predetermined movable range as the aforementioned "parameter" by controlling the tuner 26. Accordingly, the minimum value of the reflection wave spectrum and the minimum reflection frequency are varied, and, as a result, the absorption power is changed.

Figure 9:
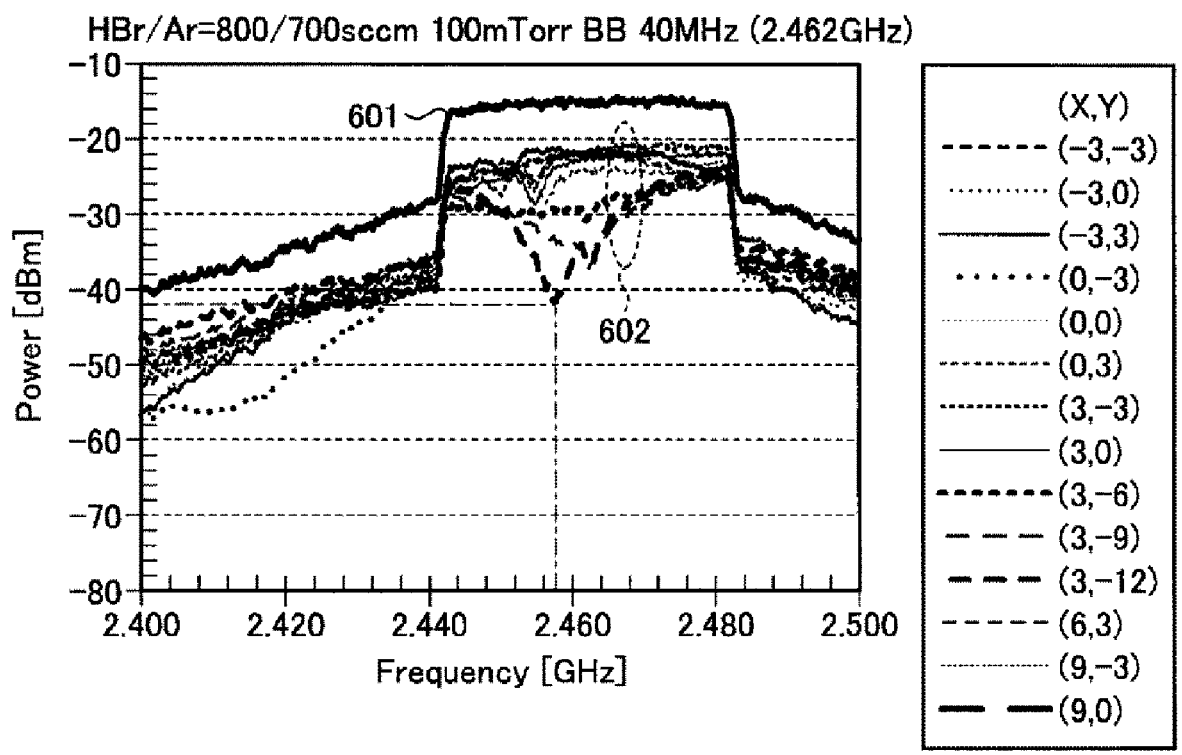
FIG. 9 is a diagram for describing a variation of the absorption power in relation to a protruding position of a movable plate of a tuner.

FIG. 9 is a diagram for describing the variation of the absorption power in relation to the protruding positions of the movable plates of the tuner. In FIG. 9, a horizontal axis represents a frequency [GHz], and a vertical axis indicates a power [dBm]. In FIG. 9, a graph 601 shows the progressive wave spectrum when the protruding positions of the movable plates 26a and 26b are swept (varied), and a graph group 602 indicates the reflection wave spectrum when the protruding positions of the movable plates 26a and 26b are swept (varied). Further, in FIG. 9, (X, Y) is a combination of the protruding positions of the movable plates 26a and 26b; X denotes the protruding position (mm) of the movable plate 26a; and Y denotes the protruding position (mm) of the movable plate 26b. In FIG. 9, the absorption power corresponds to an area of regions formed between the graph 601 and individual graphs of the graph group 602. In the example of FIG. 9, as processing conditions, a processing gas and a flow rate are HBr/Ar=800 sccm/700 sccm; the pressure is set to be 100 mTorr; and the frequency band of the carrier wave group is set to be 40 MHz.

As can be seen from FIG. 9, if the protruding positions of the movable plates 26a and 26b are swept, the minimum value of the reflection wave spectrum and the minimum reflection frequency are varied. In the example of FIG. 9, when the protruding position of the movable plate 26a is 3 mm and the protruding position of the movable plate 26b is −12 mm, the minimum value of the reflection wave spectrum reaches the lowest, and, as a result, the absorption power reaches the maximum.

Referring back to FIG. 8, the control unit 100 determines whether the protruding positions of the movable plates 26a and 26b exceed the upper limit of the predetermined movable range (process S208). If the protruding positions of the movable plates 26a and 26b do not exceed the upper limit of the predetermined movable range (No in the process S208), the control unit 100 returns the processing back to the process S204.

On the other hand, if the protruding positions of the movable plates 26a and 26b exceed the upper limit of the predetermined movable range (Yes in the process S208), the control unit 100 specifies, by referring to the storage unit 103, the protruding positions of the movable plates 26a and 26b at which the absorption power becomes equal to or larger than the threshold value (process S209). The specified protruding positions of the movable plates 26a and 26b are set to the tuner 26 by the control unit 100.

As stated above, when generating the plasma within the processing vessel 12 by using the carrier wave group, the plasma processing apparatus 1 according to the second exemplary embodiment calculates the absorption power by using the progressive wave spectrum and the reflection wave spectrum and adjusts the protruding positions of the movable plates 26a and 26b of the tuner 26 such that the absorption power becomes equal to or larger than the threshold value. Accordingly, while following the adjustment of the protruding positions of the movable plates 26a and 26b of the tuner 26, the minimum value of the reflection wave spectrum and the minimum reflection frequency can be varied, so that the absorption power can be maximized. As a result, the power of the carrier wave group can be absorbed into the plasma with high efficiency.

Third Exemplary Embodiment

A third exemplary embodiment is directed to a variation of a method of adjusting the aforementioned "parameter." A basic configuration of a plasma processing apparatus according to the third exemplary embodiment is the same as that of the first exemplary embodiment.

In the plasma processing apparatus 1 according to the third exemplary embodiment, the control unit 100 adjust the aforementioned "parameter" such that the absorption power becomes equal to or larger than the threshold value and the minimum reflection frequency belongs to a frequency range at which an abnormal discharge does not occur within the processing vessel 12.

Figure 10:
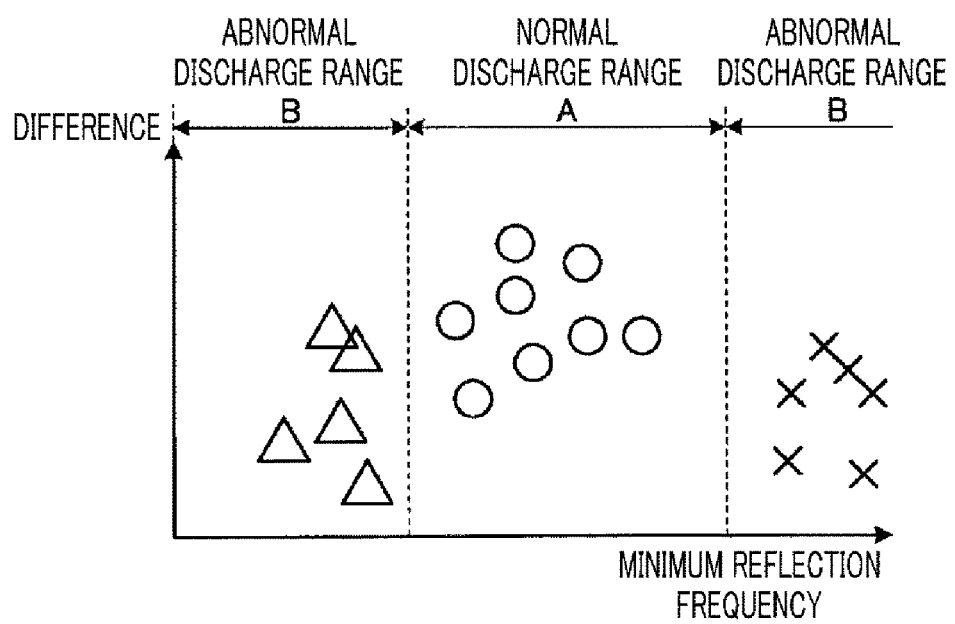
FIG. 10 is a diagram for describing an example of an operation of a control unit according to a third exemplary embodiment.

FIG. 10 is a diagram for describing an example of an operation of the control unit according to the third exemplary embodiment. In FIG. 10, a horizontal axis represents the minimum reflection frequency, and a vertical axis indicates a difference between the progressive wave spectrum and the reflection wave spectrum. Further, in FIG. 10, a normal discharge range A indicates a frequency range in which the abnormal discharge does not take place within the processing vessel 12, and an abnormal discharge range B indicates a frequency range in which the abnormal discharge occurs within the processing vessel 12. Here, the abnormal discharge refers to an electric discharge which occurs at a position other than a previously allowed position within the processing vessel 12. The normal discharge range A and the abnormal discharge range B are previously determined through an experiment or the like.

The control unit 100 sweeps the center frequency of the carrier wave group as the aforementioned "parameter" by controlling the carrier wave group generating unit 16. Then, by selecting, among the multiple center frequencies of the carrier wave group obtained by the sweeping, only the center frequency of the carrier wave group at which the minimum reflection frequency belongs to the normal discharge range A shown in FIG. 10, the control unit 100 finds the center frequency of the carrier wave group at which the absorption power becomes equal to or larger than the threshold value.

As stated above, the plasma processing apparatus 1 according to the third exemplary embodiment adjusts the center frequency of the carrier wave group as the aforementioned "parameter" such that the absorption power becomes equal to or larger than the threshold value and the minimum reflection frequency belongs to the frequency range in which no abnormal discharge occurs within the processing vessel 12. As a consequence, the power of the carrier wave group can be absorbed into the plasma with high efficiency while suppressing the occurrence of the abnormal discharge.

Fourth Exemplary Embodiment

A fourth exemplary embodiment is different from the third exemplary embodiment in that an alarm is generated when the minimum reflection frequency falls out of the frequency range in which no abnormal discharge occurs within the processing vessel 12. A basic configuration of a plasma processing apparatus according to the fourth exemplary embodiment is the same as that of the third exemplary embodiment.

The minimum reflection frequency is known to be varied with a lapse of time as the processing vessel 12 is consumed or a component within the processing vessel 12 is consumed. In consideration of this, in the fourth exemplary embodiment, an alarm is set forth to notify a maintenance timing for the processing vessel 12 or the component within the processing vessel 12 by using the minimum reflection frequency.

That is, in the plasma processing apparatus 1 according to the fourth exemplary embodiment, the control unit 100 set forth the alarm if the minimum reflection frequency falls out of the frequency range in which no abnormal discharge occurs within the processing vessel 12. By way of example, in case that the minimum reflection frequency falls out of the frequency range in which no abnormal discharge occurs within the processing vessel 12, the control unit 100 sets forth the alarm by displaying a message urging maintenance of the processing vessel 12 or the component within the processing vessel 12 on a non-illustrated display.

Figure 11:
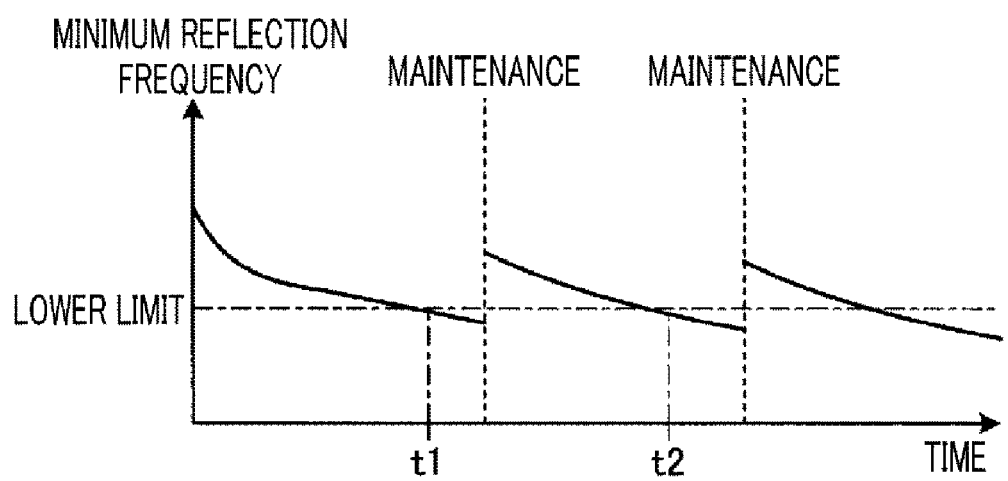
FIG. 11 is a diagram for describing an example of an operation of the control unit according to a fourth exemplary embodiment.

FIG. 11 is a diagram for describing an example of an operation of the control unit according to the fourth exemplary embodiment. In FIG. 11, a horizontal axis represents a time, and a vertical axis represents the minimum reflection frequency. In FIG. 11, a "lower limit" indicates a lower limit of the frequency range in which no abnormal discharge occurs within the processing vessel 12.

As depicted in FIG. 11, the minimum reflection frequency is varied with a lapse of time as the processing vessel 12 is consumed or the component within the processing vessel 12 is consumed. It is assumed that, due to this variation with the lapse of time, the minimum reflection frequency falls, at a time point t1, below the lower limit of the frequency range in which no abnormal discharge occurs within the processing vessel 12. In this case, the control unit 100 sets forth the alarm at the time point t1 by displaying the message urging the maintenance of the processing vessel 12 or the component within the processing vessel 12 on the non-illustrated display. Thus, a user of the plasma processing apparatus 1, who has received the alarm, may perform the maintenance of the processing vessel 12 or the component within the processing vessel 12. If so, the minimum reflection frequency may falls back into the frequency range in which no abnormal discharge occurs within the processing vessel 12. Afterwards, the minimum reflection frequency is varied again with a lapse of time as the processing vessel 12 is consumed or the component of the processing vessel 12 is consumed. It is assumed that, due to this variation with the lapse of time, the minimum reflection frequency falls, at a time point t2, below the lower limit of the frequency range in which no abnormal discharge occurs within the processing vessel 12. In this case, the control unit 100 sets forth the alarm at the time point t2 by displaying the message urging the maintenance of the processing vessel 12 or the component within the processing vessel 12 on the non-illustrated display. Afterwards, this processing is repeated.

As stated above, the plasma processing apparatus 1 according to the fourth exemplary embodiment sets forth the alarm when the minimum reflection frequency falls out of the frequency range in which the abnormal discharge does not occur within the processing vessel 12. Resultantly, it is possible to notify the timing for the maintenance for the processing vessel 12 or the component within the processing vessel 12 by using the minimum reflection frequency.

The above-described exemplary embodiments are not limiting, and various changes and modifications may be made without departing from the scope of the present disclosure.

By way of example, in the above-described various exemplary embodiments, though the control unit 100 adjusts the aforementioned "parameter" such that the absorption power becomes equal to or larger than the threshold value, the exemplary embodiments are not limited thereto. For example, the control unit 100 may adjust the aforementioned "parameter" such that the absorption power reaches the maximum value. Accordingly, the power of the carrier wave group can be absorbed into the plasma more efficiently.

Further, in the above-described various exemplary embodiment, after adjusting the aforementioned "parameter," the control unit 100 may adjust, by controlling the carrier wave group generating unit 16, the power of the progressive wave of the carrier wave group such that the absorption power has a preset value equal to or larger than the threshold value.

Figure 12A:
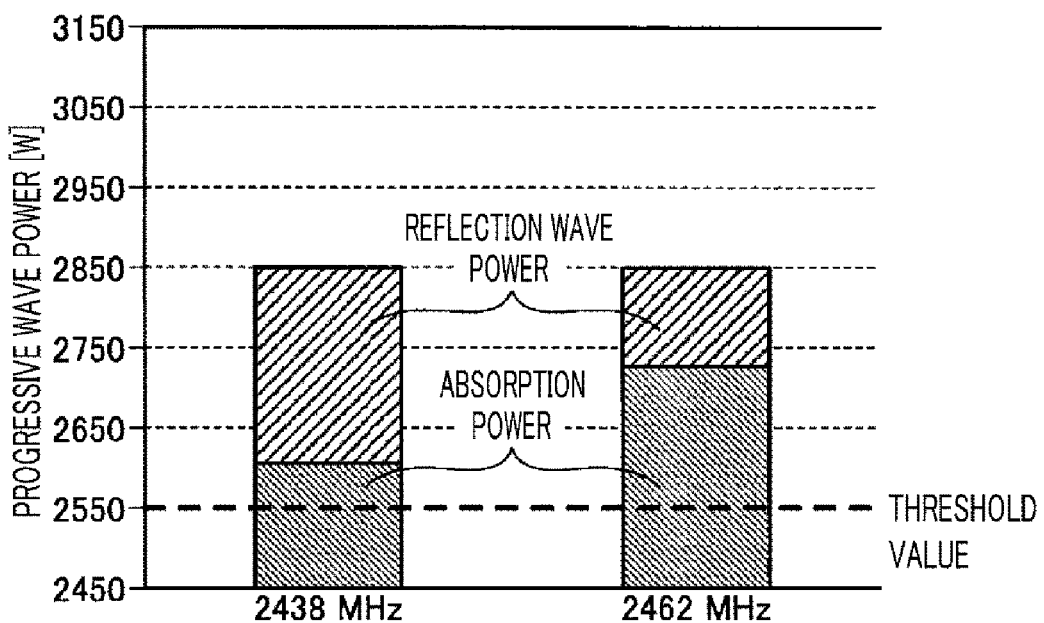
FIG. 12A is a diagram for describing adjustment of a power of a progressive wave of a carrier wave group.
Figure 12B:
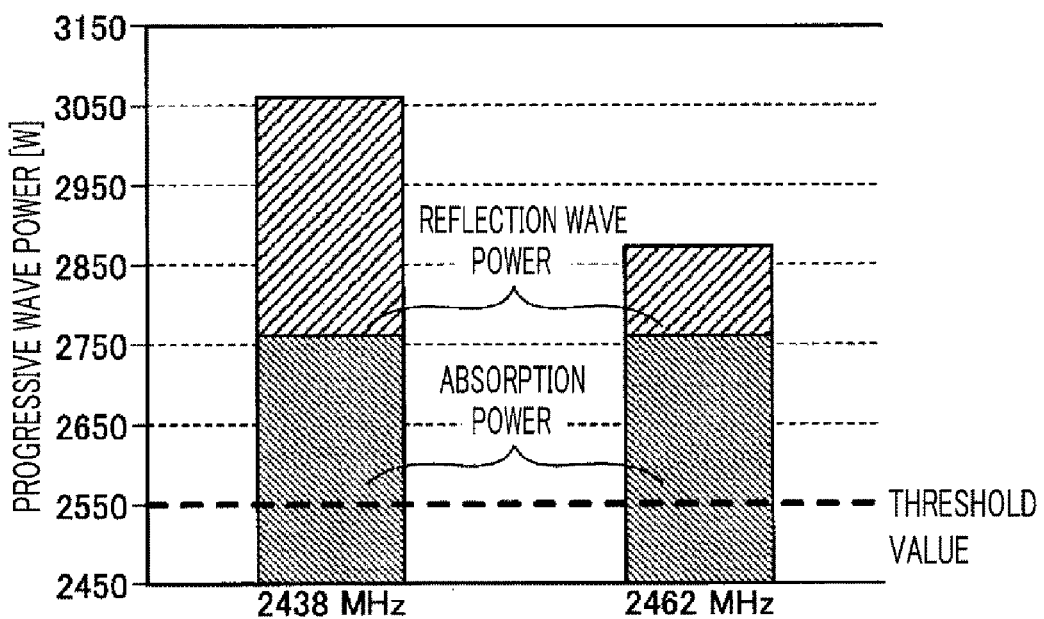
FIG. 12B is a diagram for describing adjustment of the power of the progressive wave of the carrier wave group.

FIG. 12A and FIG. 12B are diagrams for describing the adjustment of the power of the progressive wave of the carrier wave group. In FIG. 12A and FIG. 12B, a horizontal axis represents the center frequency of the carrier wave group, and a vertical axis represents the power (W) of the progressive wave of the carrier wave group. Further, the power of the progressive wave of the carrier wave group corresponds to a sum of the absorption power and the power of the reflection wave of the carrier wave group. FIG. 12A shows a state in which the control unit 100 adjusts the center frequency of the carrier wave group to 2438 MHz or 2462 MHz as the aforementioned "parameter" by controlling the carrier wave group generating unit 16 such that the absorption power becomes equal to or larger than 2550 W which is the threshold value. Further, FIG. 12B shows a state in which, after adjusting the center frequency of the carrier wave group to 2438 MHz or 2462 MHz, the control unit 100 adjusts the power of the progressive wave of the carrier wave group by controlling the carrier wave group generating unit 16 such that the absorption power becomes 2750 W which is a preset value equal or larger than the threshold value.

Figure 13A:
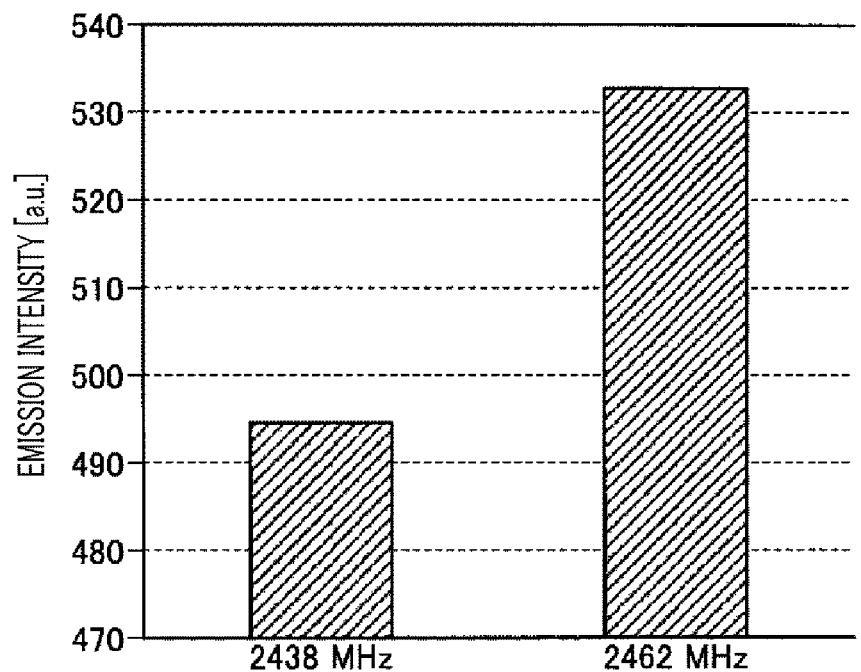
FIG. 13A is a diagram for describing an effect achieved by the adjustment of the power of the progressive wave of the carrier wave group.
Figure 13B:
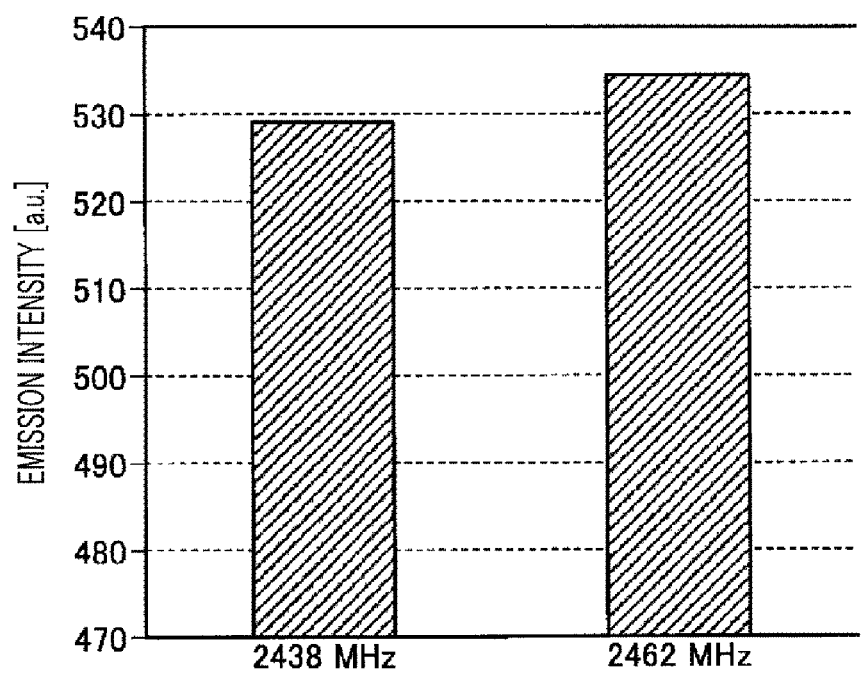
FIG. 13B is a diagram for describing the effect achieved by the adjustment of the power of the progressive wave of the carrier wave group.

FIG. 13A and FIG. 13B are diagrams for describing an effect of the adjustment of the power of the progressive wave of the carrier wave group. In FIG. 13A and FIG. 13B, a horizontal axis represents the center frequency of the carrier wave group, and a vertical axis represents an emission intensity [a.u.] of the plasma generated within the processing vessel 12 by using the carrier wave group. FIG. 13A shows an emission intensity of the plasma when the center frequency of the carrier wave group is adjusted to 2438 MHz and an emission intensity of the plasma when the center frequency of the carrier wave group is set to 2462 MHz. Further, FIG. 13B shows an emission intensity of the plasma when the power of the progressive wave of the carrier wave group is adjusted such that the absorption power reaches 2750 W which is the preset value equal to or larger than the threshold value after the center frequency of the carrier wave group is adjusted to 2438 MHz, and also shows an emission intensity of the plasma when the power of the progressive wave of the carrier wave group is adjusted such that the absorption power reaches 2750 W which is the preset value equal to or larger than the threshold value after the center frequency of the carrier wave group is adjusted to 2462 MHz.

As depicted in FIG. 13A, in case of not adjusting the power of the progressive wave of the carrier wave group, there is found a relatively big difference between the emission intensity of the plasma with the carrier wave group having the center frequency adjusted to 2438 MHz and the emission intensity of the plasma with the carrier wave group having the center frequency adjusted to 2462 MHz.

In contrast, as shown in FIG. 13B, in case of adjusting the power of the progressive wave of the carrier wave group, a difference between the emission intensity of the plasma with the carrier wave group having the center frequency adjusted to 2438 MHz and the emission intensity of the plasma with the carrier wave group having the center frequency adjusted to 2462 MHz is reduced. That is, it is found out that by adjusting the power of the progressive wave of the carrier wave group such that the absorption power becomes the preset value of 2750 W equal to or larger than the threshold value, the variation of the emission intensity of the plasma, in other words, a variation of a density of the plasma can be suppressed.

EXPLANATION OF REFERENCE NUMERALS

1: Plasma processing apparatus
12: Processing vessel
14: Stage
16: Carrier wave group generating unit
18: Antenna
20: Dielectric window
30: Slot plate
38: Gas supply system
100: Control unit
101: Controller
102: User interface
103: Storage unit

We claim:
1. A plasma processing apparatus, comprising:
a processing vessel;

a carrier wave group generating unit configured to generate a carrier wave group including multiple carrier waves having different frequencies belonging to a preset frequency band centered on a predetermined center frequency;

a plasma generating unit configured to generate plasma within the processing vessel by using the carrier wave group;

a spectrum detecting unit configured to detect a progressive wave spectrum, which is a frequency spectrum of a progressive wave of the carrier wave group, and a reflection wave spectrum, which is a frequency spectrum of a reflection wave of the carrier wave group; and a control unit configured to calculate, by using the progressive wave spectrum and the reflection wave spectrum, an absorption power which is a power of the carrier wave group absorbed into the plasma, and configured to adjust a parameter, which varies a minimum value of the reflection wave spectrum and a frequency corresponding to the minimum value, such that the absorption power becomes equal to or larger than a threshold value.

2. The plasma processing apparatus of claim 1,
wherein the control unit controls the carrier wave group generating unit to search for the center frequency of the carrier wave group at which the absorption power becomes equal to or larger than the threshold value, by sweeping the center frequency of the carrier wave group as the parameter.

3. The plasma processing apparatus of claim 1, further comprising:
a tuner, having a movable member allowed to be moved, configured to match impedances between the carrier wave group generating unit and the processing vessel depending on a position of the movable member with respect to a reference position,
wherein the control unit controls the tuner to search for the position of the movable member at which the absorption power becomes equal to or larger than the threshold value, by sweeping the position of the movable member as the parameter.

4. The plasma processing apparatus of claim 1,
wherein the control unit adjusts the parameter such that the absorption power becomes equal to or larger than the threshold value and the frequency corresponding to the minimum value of the reflection wave spectrum belongs to a frequency range in which no abnormal discharge occurs within the processing vessel.

5. The plasma processing apparatus of claim 4,
wherein the frequency corresponding to the minimum value of the reflection wave spectrum is varied with a lapse of time as the processing vessel is consumed or a component within the processing vessel is consumed, and
the control unit generates an alarm when the frequency corresponding to the minimum value of the reflection wave spectrum falls out of the frequency range in which no abnormal discharge occurs within the processing vessel.

6. The plasma processing apparatus of claim 1,
wherein the control unit adjusts the parameter such that the absorption power reaches a maximum value.

7. The plasma processing apparatus of claim 1,
wherein, after adjusting the parameter, the control unit controls the carrier wave group generating unit to adjust a power of the progressive wave of the carrier wave group such that the absorption power becomes a preset value equal to or larger than the threshold value.

8. A plasma processing method performed in a plasma processing apparatus,
wherein the plasma processing apparatus comprises:
a processing vessel;
a carrier wave group generating unit configured to generate a carrier wave group including multiple carrier waves having different frequencies belonging to a preset frequency band centered on a predetermined center frequency;
a plasma generating unit configured to generate plasma within the processing vessel by using the carrier wave group; and
a spectrum detecting unit configured to detect a progressive wave spectrum, which is a frequency spectrum of a progressive wave of the carrier wave group, and a reflection wave spectrum, which is a frequency spectrum of a reflection wave of the carrier wave group, and
wherein the plasma processing method comprises:
calculating, by using the progressive wave spectrum and the reflection wave spectrum, an absorption power which is a power of the carrier wave group absorbed into the plasma; and
adjusting a parameter, which varies a minimum value of the reflection wave spectrum and a frequency corresponding to the minimum value, such that the absorption power becomes equal to or larger than a threshold value.

* * * * *